(12) United States Patent
Gouchi

(10) Patent No.: US 10,644,371 B2
(45) Date of Patent: May 5, 2020

(54) MULTILAYER SUBSTRATE COMPRISING A FLEXIBLE ELEMENT ASSEMBLY AND CONDUCTOR LAYERS

(71) Applicant: Murata Manufacturing Co., Ltd., Nagaokakyo-shi, Kyoto-fu (JP)

(72) Inventor: Naoki Gouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/876,241

(22) Filed: Jan. 22, 2018

(65) Prior Publication Data

US 2018/0145391 A1    May 24, 2018

Related U.S. Application Data

(63) Continuation of application No. PCT/JP2016/079871, filed on Oct. 6, 2016.

(30) Foreign Application Priority Data

Oct. 13, 2015  (JP) .................................. 2015-201688
Aug. 31, 2016  (JP) .................................. 2016-168663

(51) Int. Cl.
*H01P 3/08*   (2006.01)
*H05K 3/36*   (2006.01)
(Continued)

(52) U.S. Cl.
CPC ............. *H01P 3/082* (2013.01); *H01P 1/022* (2013.01); *H01P 3/006* (2013.01); *H01P 3/026* (2013.01);
(Continued)

(58) Field of Classification Search
CPC .. H01P 3/08; H01P 3/081; H01P 3/082; H01P 3/026; H01P 11/003
(Continued)

(56) References Cited

U.S. PATENT DOCUMENTS 5,965,935 A  * 10/1999  Bahl et al. .............. H01L 23/66
                                                          257/631
7,719,378 B2 *  5/2010  Blair et al. .............. H01P 3/006
                                                            333/1
(Continued)

FOREIGN PATENT DOCUMENTS

JP   2008-091634 A   4/2008
JP   2014-086655 A   5/2014
(Continued)

OTHER PUBLICATIONS

Official Communication issued in International Patent Application No. PCT/JP2016/079871, dated Dec. 20, 2016.

*Primary Examiner* — Benny T Lee
(74) *Attorney, Agent, or Firm* — Keating & Bennett, LLP

(57) ABSTRACT

A multilayer substrate includes an element assembly including stacked insulating layers and including at least a first insulating layer with a first principal surface and a second principal surface and a second insulating layer with a third principal surface and a fourth principal surface, a first conductor layer, and a second conductor layer. The second principal surface and the third principal surface are in contact with each other, and no planar or linear conductors are located on the second principal surface and the third principal surface. The first conductor layer is located on the first principal surface, and the second conductor layer is located on the fourth principal surface.

20 Claims, 9 Drawing Sheets

(51) Int. Cl.
  *H05K 1/14* (2006.01)
  *H05K 1/02* (2006.01)
  *H01P 3/00* (2006.01)
  *H01P 3/02* (2006.01)
  *H01P 1/02* (2006.01)
  *H01P 11/00* (2006.01)

(52) U.S. Cl.
  CPC ............ *H01P 11/003* (2013.01); *H05K 1/028* (2013.01); *H05K 1/0245* (2013.01); *H05K 1/0251* (2013.01); *H05K 1/148* (2013.01); *H05K 3/365* (2013.01); *H05K 1/14* (2013.01); *H05K 2201/0191* (2013.01); *H05K 2201/10189* (2013.01)

(58) Field of Classification Search
  USPC ......................................................... 333/238
  See application file for complete search history.

(56) References Cited

U.S. PATENT DOCUMENTS

| | | |
|---|---|---|
| 2008/0078573 A1 | 4/2008 | Hu et al. |
| 2015/0036303 A1 | 2/2015 | Yosui et al. |
| 2015/0087353 A1 | 3/2015 | Yosui |
| 2015/0155611 A1 | 6/2015 | Yosui et al. |

FOREIGN PATENT DOCUMENTS

| | | |
|---|---|---|
| JP | 2015-002271 A | 1/2015 |
| WO | 2014/057759 A1 | 4/2014 |
| WO | 2014/069258 A1 | 5/2014 |
| WO | 2014/125988 A1 | 8/2014 |

\* cited by examiner

Fig.6A
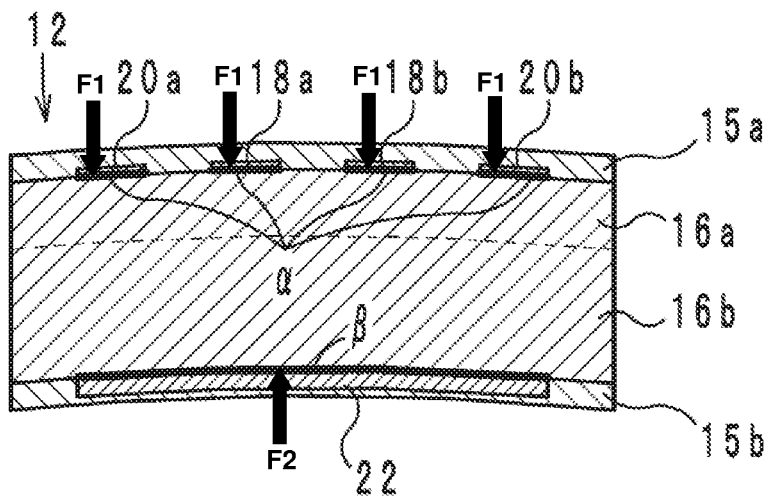
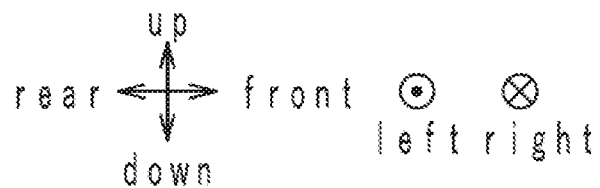
Fig.6B
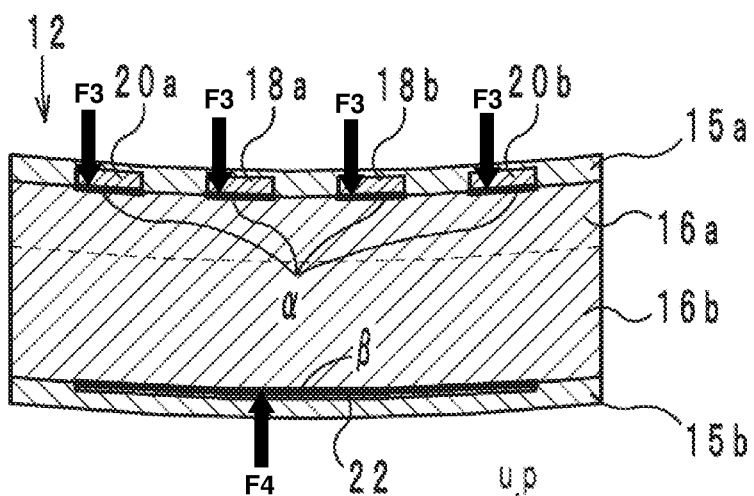

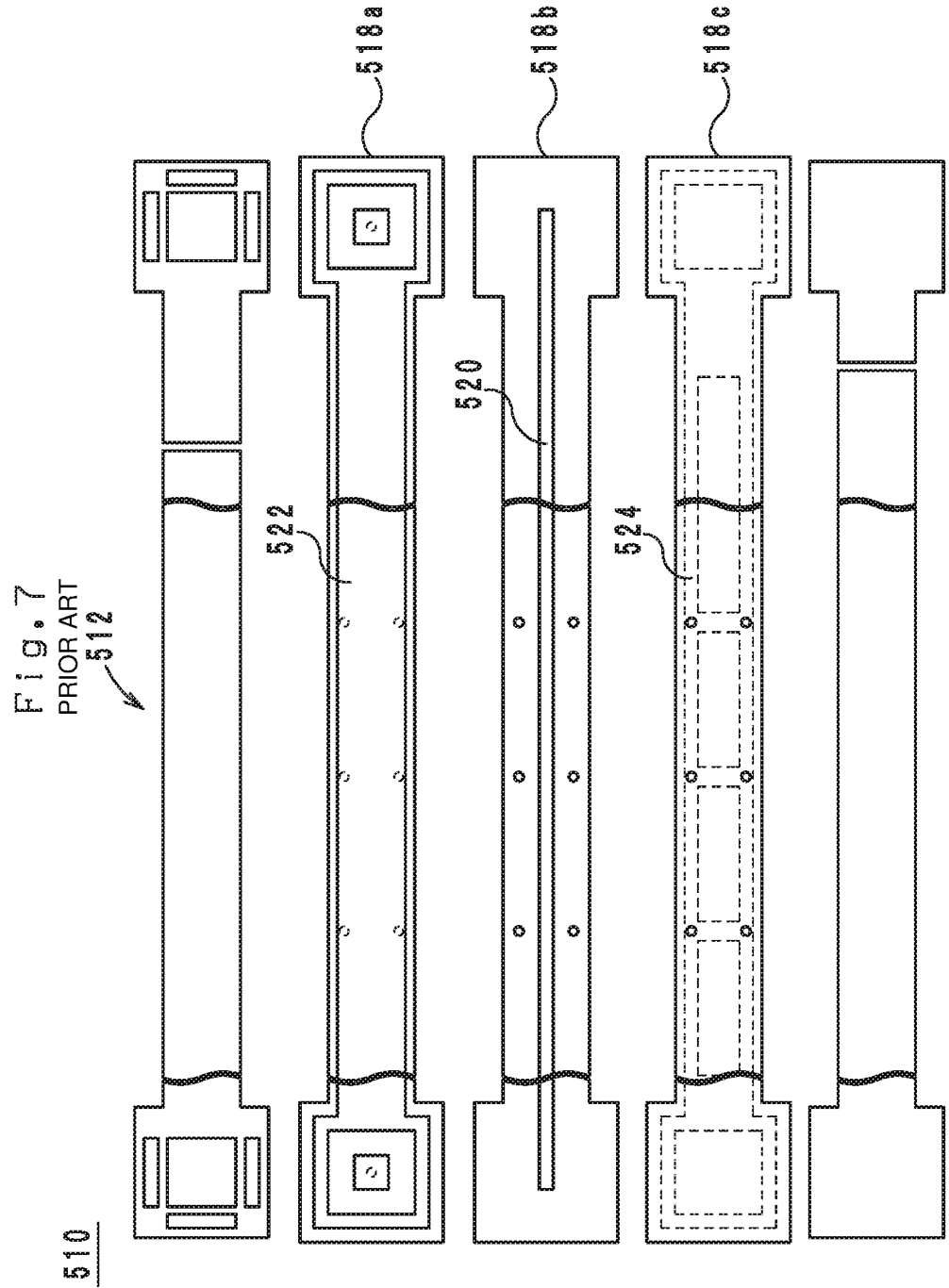

MULTILAYER SUBSTRATE COMPRISING A FLEXIBLE ELEMENT ASSEMBLY AND CONDUCTOR LAYERS

CROSS REFERENCE TO RELATED APPLICATIONS

This application claims the benefit of priority to Japanese Patent Application No. 2015-201688 filed on Oct. 13, 2015 and Japanese Patent Application No. 2016-168663 filed on Aug. 31, 2016 and is a Continuation Application of PCT Application No. PCT/JP2016/079871 filed on Oct. 6, 2016. The entire contents of these applications are hereby incorporated herein by reference.

BACKGROUND OF THE INVENTION

1. Field of the Invention

The present invention relates to a multilayer substrate including a plurality of insulating layers stacked on one another.

2. Description of the Related Art

A flexible substrate disclosed in Japanese Patent Application Publication No. 2014-86655 is known. FIG. 7 is an exploded view of a flexible substrate 510 of the prior art.

The flexible substrate 510 includes a dielectric element assembly 512, a signal line 520, and ground conductors 522 and 524. The dielectric element assembly 512 includes dielectric sheets 518a, 518b and 518c stacked in this order from top to bottom. The signal line 520 is located on the upper surface of the dielectric sheet 518b. The ground conductor 522 is located on the upper surface of the dielectric sheet 518a. The ground conductor 524 is located on the lower surface of the dielectric sheet 518c. Accordingly, the signal line 520, and the ground conductors 522 and 524 define a stripline structure.

In order to provide the flexible substrate 510 with a microstripline structure, for example, it is possible to omit the dielectric sheet 518a and the ground conductor 522. Then, the signal line 520 and the ground conductor 524 define a microstripline structure.

When such a flexible substrate including a microstripline structure is subjected to an external force or when the temperature of such a flexible substrate changes, delamination is likely to occur at the border between the dielectric sheet 518b and the dielectric sheet 518c.

SUMMARY OF THE INVENTION

Preferred embodiments of the present invention provide multilayer substrates that significantly reduce or prevent delamination.

A multilayer substrate according to a preferred embodiment of the present invention includes a flexible element assembly including a plurality of insulating layers stacked on one another in a layer stacking direction, the plurality of insulating layers including at least a first insulating layer with a first principal surface and a second principal surface and a second insulating layer with a third principal surface and a fourth principal surface, a first conductor layer, and a second conductor layer, wherein the second principal surface and the third principal surface are in contact with each other, no planar or linear conductors are located on the second principal surface and the third principal surface, the first conductor layer is located on the first principal surface, the second conductor layer is located on the fourth principal surface, when the plurality of insulating layers include one or more other insulating layers in addition to the first insulating layer and the second insulating layer, no conductor layers are located on the one or more other insulating layers, a ratio of an area of the first conductor layer to an area of the first principal surface is lower than a ratio of an area of the second conduct layer or to an area of the fourth principal surface, and a thickness of the first insulating layer is smaller than a thickness of the second insulating layer.

According to the preferred embodiments of the present invention, delamination of multilayer substrates is able to be significantly reduced or prevented.

The above and other elements, features, steps, characteristics and advantages of the present invention will become more apparent from the following detailed description of the preferred embodiments with reference to the attached drawings, where the same or similar features in the drawings are denoted by the same reference labels.

BRIEF DESCRIPTION OF THE DRAWINGS

FIG. 6A is a sectional view of the multilayer substrate shown in FIG. 1 when the multilayer substrate curves and the top surface thereof becomes convex upward.

FIG. 6B is a sectional view of the multilayer substrate shown in FIG. 1 when the multilayer substrate curves and the top surface thereof becomes concave downward.

FIG. 7 is an exploded view of a flexible substrate of the prior art.

DETAILED DESCRIPTION OF THE PREFERRED EMBODIMENTS

Figure 1:
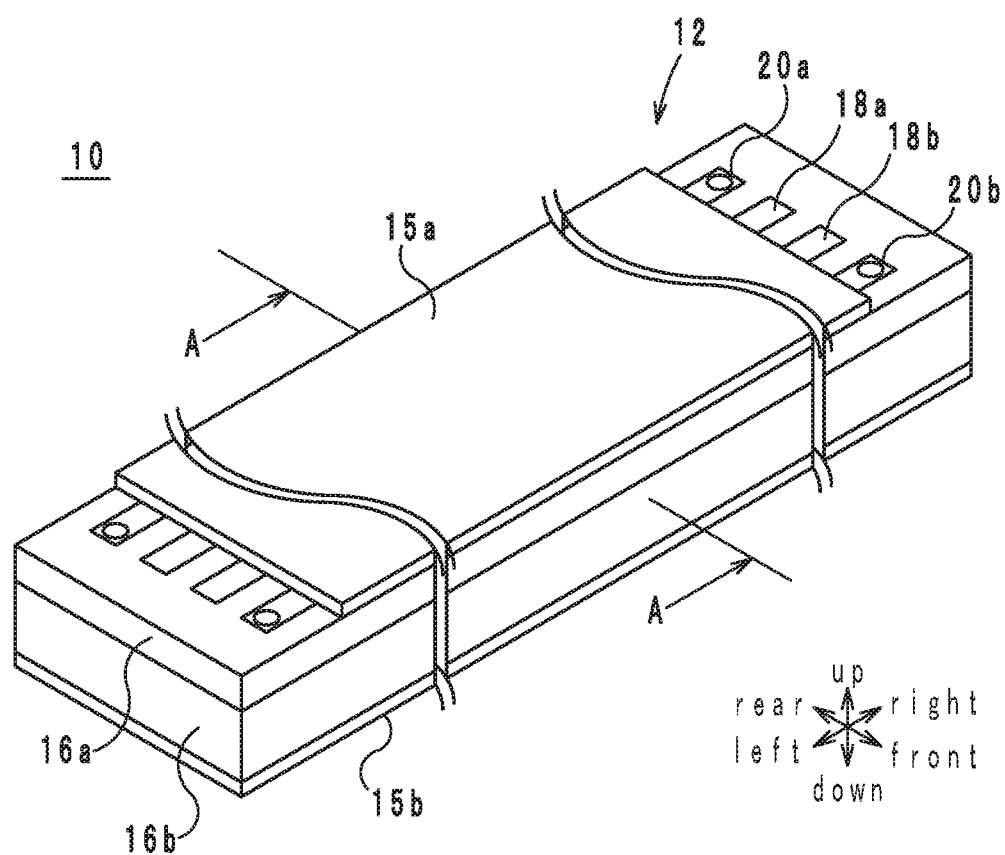
FIG. 1 is a perspective view of a multilayer substrate according to a preferred embodiment of the present invention.
Figure 2:
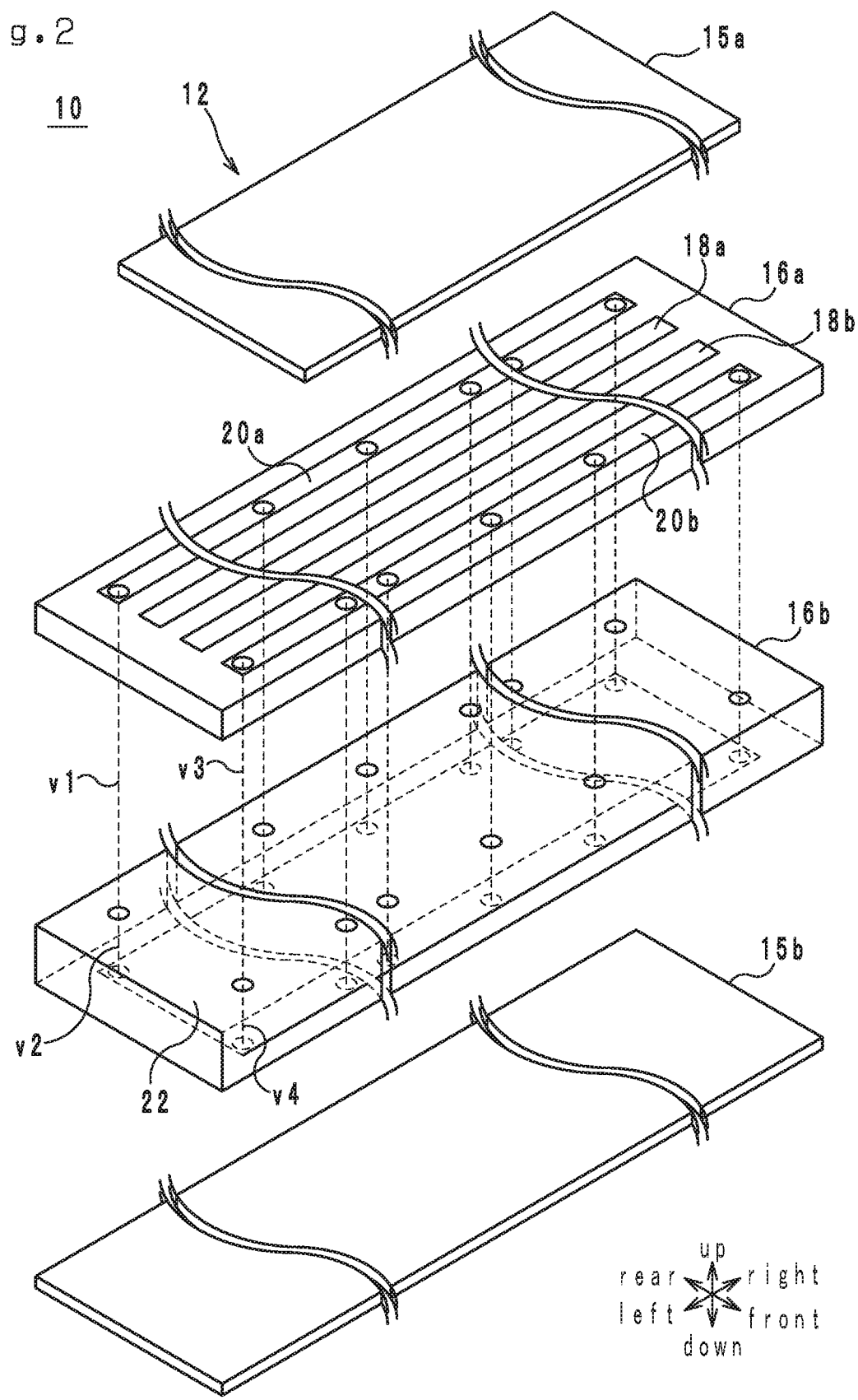
FIG. 2 is an exploded perspective view of the multilayer substrate shown in FIG. 1.
Figure 3:
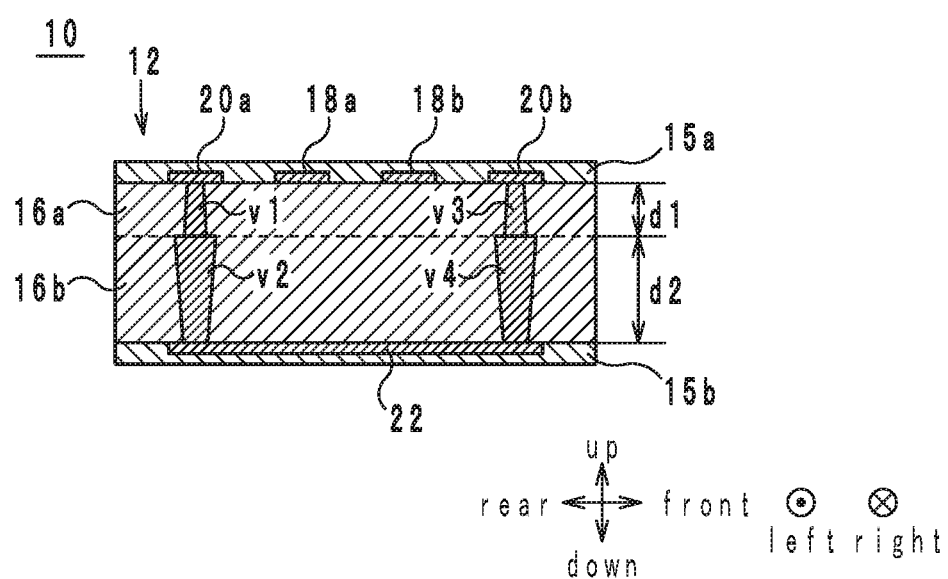
FIG. 3 is a sectional view of the multilayer substrate along the line A-A in FIG. 1.

The structure of a multilayer substrate 10 according to a preferred embodiment of the present invention is described below with reference to the drawings. FIG. 1 is a perspective view of the multilayer substrate 10. FIG. 2 is an exploded perspective view of the multilayer substrate 10. FIG. 3 is a sectional view of the multilayer substrate 10 along the line A-A in FIG. 1. In the following description, the direction in which layers of the multilayer substrate 10 are stacked on one another is referred to as an "up-down" direction. The direction in which the multilayer substrate 10 extends when viewed from above is referred to as a "right-left" direction, and the direction perpendicular to the up-down direction and the right-left direction is referred to as a "front-rear" direction. The up-down direction, the right-left direction and the front-rear direction are perpendicular to one another.

The multilayer substrate 10 is, for example, a signal line included in an electronic device, such as a cell phone or the like, to electrically connect two circuit boards to each other. The multilayer substrate 10 is a flexible substrate in a strip shape with an upper surface and a lower surface, and as shown in FIGS. 1, 2, and 3, the multilayer substrate 10 includes an element assembly 12, signal transmission conductor layers 18a and 18b, ground conductor layers 20a, 20b, and 22 (FIGS. 2 and 3), and via-hole conductors v1, v2, v3, and v4 (FIGS. 2 and 3). With regard to the via-hole conductors v1 to v4, in FIG. 2, only representative via-hole conductors are provided with the reference symbols.

The element assembly 12 includes a strip shape and extends in the right-left direction, and the element assembly 12 is flexible. As shown in FIGS. 1, 2, and 3, the element assembly 12 includes a protective layer 15a, insulating sheets 16a and 16b, and a protective layer 15b (an example of a plurality of insulating layers) stacked in this order from top to bottom. The upper surface of the element assembly 12 is referred to as a "top surface", and the lower surface of the element assembly 12 is referred to as a "bottom surface".

Each of the insulating sheets 16a and 16b (an example of a first insulating layer and an example of a second insulating layer) is a member with a strip shape extending in the right-left direction and with a same or substantially a same shape as the element assembly 12 when viewed from above. The insulating sheets 16a and 16b are insulating layers including a flexible thermoplastic resin, for example, polyimide, a liquid crystal polymer, or the like. As shown in FIG. 3, the thickness d1 of the insulating sheet 16a is smaller than the thickness d2 of the insulating sheet 16b. The insulating sheet 16a includes an upper principal surface (an example of a first principal surface) and a lower principal surface (an example of a second principal surface). The insulating sheet 16b includes an upper principal surface (an example of a third principal surface) and a lower principal surface (an example of a fourth principal surface). The upper principal surface of each of the insulating sheets 16a and 16b is referred to simply as an "upper surface", and the lower principal surface of each of the insulating sheets 16a and 16b is referred to simply as a "lower surface".

The lower surface of the insulating sheet 16a and the upper surface of the insulating sheet 16b are in contact with each other. In this preferred embodiment, the insulating sheets 16a and 16b are bonded together by thermocompression as described below, and accordingly, the lower surface of the insulating sheet 16a and the upper surface of the insulating sheet 16b are welded together. Welding the insulating sheets 16a and 16b refers to joining the insulating sheets 16a and 16b together by heating and melting the lower surface of the insulating sheet 16a and the upper surface of the insulating sheet 16b and thereafter by cooling and solidifying the melted portion. No planar or linear conductors, for example, ground conductor layers or signal transmission conductor layers, are provided on the lower surface of the insulating sheet 16a and the upper surface of the insulating sheet 16b.

As shown in FIGS. 1 and 2, the signal transmission conductor layers 18a and 18b and the ground conductor layers 20a and 20b (examples of a first conductor layer) are located on the upper surface of the insulating sheet 16a. The ground conductor layer 20a, the signal transmission conductor layers 18a and 18b and the ground conductor layer 20b are linear conductor layers extending in the right-left direction and are arranged in this order from rear to front. Thus, the extending direction of the element assembly 12 is a same direction or substantially a same direction as the extending direction of the signal transmission conductor layers 18a and 18b and the ground conductor layers 20a and 20b.

The structure of the signal transmission conductor layers 18a and 18b and the ground conductor layers 20a and 20b being located on the upper surface of the insulating sheet 16a is described below. The statement that the signal transmission conductor layers 18a and 18b and the ground conductor layers 20a and 20b are located on the upper surface of the insulating sheet 16a indicates that the signal transmission conductor layers 18a and 18b and the ground conductor layers 20a and 20b are bonded to the upper surface of the insulating sheet 16a. The statement that the signal transmission conductor layers 18a and 18b and the ground conductor layers 20a and 20b are bonded to the upper surface of the insulating sheet 16a indicates that the signal transmission conductor layers 18a and 18b and the ground conductor layers 20a and 20b are provided, for example, by plating the upper surface of the insulating sheet 16a with metal foil and patterning the metal foil or by applying a sheet of metal foil on the upper surface of the insulating sheet 16a and patterning the sheet of metal foil, and thus peeling of the signal transmission conductor layers 18a and 18b and the ground conductor layers 20a and 20b from the upper surface of the insulating sheet 16a is significantly reduced or prevented by an anchor effect. Further, the surfaces of the signal transmission conductor layers 18a and 18b and the surfaces of the ground conductor layers 20a and 20b are smoothed, and therefore, the surface roughness of the surfaces of the signal transmission conductor layers 18a and 18b and the ground conductor layers 20a and 20b that are in contact with the insulating sheet 16a are greater than the surface roughness of the surfaces of the signal transmission conductor layers 18a and 18b and the ground conductor layers 20a and 20b that are not in contact with the insulating sheet 16a.

As shown in FIG. 2, the ground conductor layer 22 (an example of a second conductor layer) is located on the lower surface of the insulating sheet 16b. The ground conductor layer 22 is a planar conductor extending in the right-left direction and covers a significant portion of the lower surface of the insulating sheet 16b. Accordingly, when viewed from above, the ground conductor layer 22 overlaps the signal transmission conductor layers 18a and 18b and the ground conductor layers 20a and 20b. The above description of the structure of the signal transmission conductor layers 18a and 18b and the ground conductor layers 20a and 20b being located on the upper surface of the insulating sheet 16a is similarly applied to the structure of the ground conductor layer 22 being located on the lower surface of the insulating sheet 16b, and the structure of the ground conductor layer 22 being located on the lower surface of the insulating sheet 16b will not be described.

The signal transmission conductor layers 18a and 18b and the ground conductor layers 20a and 20b cover a portion of the upper surface of the insulating sheet 16a, and the ground conductor layer 22 covers a significant portion of the lower surface of the insulating sheet 16b. Accordingly, the ratio of the total area of the signal transmission conductor layers 18a and 18b and the ground conductor layers 20a and 20b to the area of the upper surface of the insulating sheet 16a is lower than the ratio of the area of the ground conductor layer 22 to the area of the lower surface of the insulating sheet 16b.

The signal transmission conductor layers 18a and 18b and the ground conductor layers 20a, 20b, and 22 include copper or other metal foil.

The plurality of via-hole conductors v1 (an example of a first via-hole conductor) pierce through the insulating sheet 16a in the up-down direction. The plurality of via-hole conductors v2 (an example of a second via-hole conductor) pierce through the insulating sheet 16b in the up-down direction. Each of the via-hole conductors v1 connects with the adjacent via-hole conductor v2 to define one via-hole conductor that electrically connects the ground conductor layer 20a to the ground conductor layer 22. The via-hole conductors v1 are arranged in a line in the right-left direction at uniform or substantially uniform intervals, and the via-hole conductors v2 are arranged in a line in the right-left direction at uniform or substantially uniform intervals.

The plurality of via-hole conductors v3 (an example of a first via-hole conductor) pierce through the insulating sheet 16a in the up-down direction. The plurality of via-hole conductors v4 (an example of a second via-hole conductor) pierce through the insulating sheet 16b in the up-down direction. Each of the via-hole conductors v3 connects with the adjacent via-hole conductor v4 to define one via-hole conductor that electrically connects the ground conductor layer 20b to the ground conductor layer 22. The via-hole conductors v3 are arranged in a line in the right-left direction at uniform or substantially uniform intervals, and the via-hole conductors v4 are arranged in a line in the right-left direction at uniform or substantially uniform intervals.

The via-hole conductors v1 to v4 are preferably formed by sintering a Cu—Sn-based conductive paste, for example.

The protective layer 15a (an example of one or more other insulating layers) is an insulating layer covering a significant portion of the upper surface of the insulating sheet 16a. The protective layer 15a does not cover the right and left end portions of the insulating sheet 16a as shown in FIG. 1. Accordingly, both end portions of the signal transmission conductor layers 18a and 18b and both end portions of the ground conductor layers 20a and 20b are exposed to an exterior of the element assembly 12, and these portions define and function as external electrodes that electrically connect to corresponding connectors. The protective layer 15a includes a resin, for example, an epoxy resin or the like.

The protective layer 15b (an example of one or more other insulating layers) is an insulating layer covering a significant portion of the lower surface of the insulating sheet 16b. The protective layer 15b includes a resin, for example, an epoxy resin or the like. The ground conductor layer 22 is not bonded to the protective layer 15b, or alternatively, the ground conductor layer 22 is more weakly bonded to the protective layer 15b than to the lower surface of the insulating sheet 16b.

No conductive patterns are provided on the protective layers 15a and 15b. The statement that no conductive patterns are provided on the protective layers 15a and 15b indicates that any conductor layers defining inductors, capacitors and any other circuit elements, any conductor layers defining and functioning as wiring conductors, ground conductors and the like, and any interlayer connection conductors (for example, via-hole conductors and the like) are not provided on the protective layers 15a and 15b. However, a direction discrimination mark (not shown) and any other conductor layer that provides no function as a portion of an electrical circuit may be located on the protective layers 15a and 15b.

The material defining the signal transmission conductor layers 18a and 18b and the ground conductor layers 20a, 20b, and 22 is different in an elasticity coefficient from the material defining the insulating sheets 16a and 16b and the material defining the protective layers 15a and 15b. In the present preferred embodiment, the material of the signal transmission conductor layers 18a and 18b and the ground conductor layers 20a, 20b, and 22 is copper, the material of the insulating sheets 16a and 16b is a liquid crystal polymer, and the material of the protective layers 15a and 15b is an epoxy resin. Therefore, the elasticity coefficient of the material of the signal transmission conductor layers 18a and 18b and the ground conductor layers 20a, 20b, and 22 is greater than the elasticity coefficients of the material of the insulating sheets 16a and 16b and the material of the protective layers 15a and 15b. Accordingly, the signal transmission conductor layers 18a and 18b and the ground conductor layers 20a, 20b, and 22 are less deformable than the insulating sheets 16a and 16b and the protective layers 15a and 15b.

The material defining the signal transmission conductor layers 18a and 18b and the ground conductor layers 20a, 20b, and 22 is different in a linear expansion coefficient from the material defining the insulating sheets 16a and 16b and the material defining the protective layers 15a and 15b. In the present preferred embodiment, the linear expansion coefficient of the material of the signal transmission conductor layers 18a and 18b and the ground conductor layers 20a, 20b, and 22 is smaller than the linear expansion coefficients of the material of the insulating sheets 16a and 16b and the material of the protective layers 15a and 15b.

Figure 4:
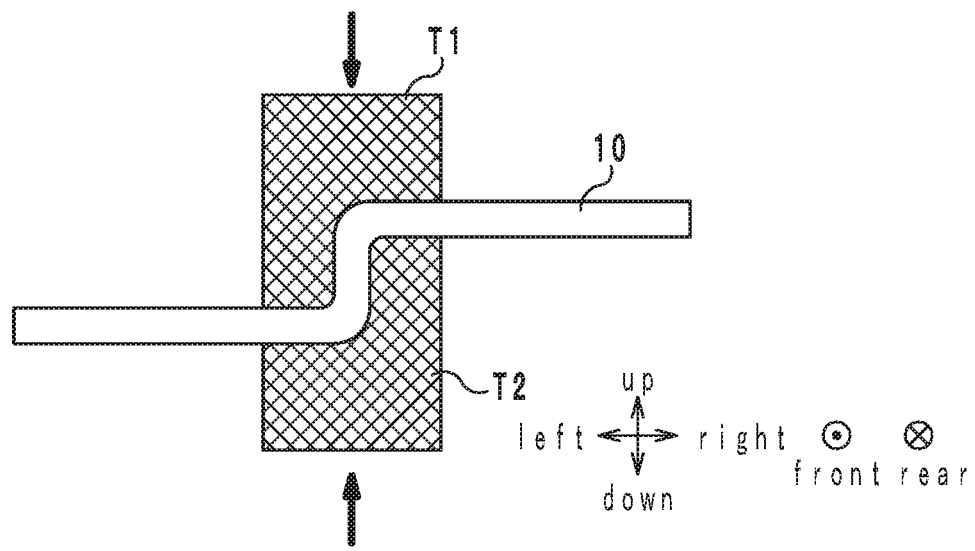
FIG. 4 is a diagram showing bending of the multilayer substrate shown in FIG. 1.
Figure 5:
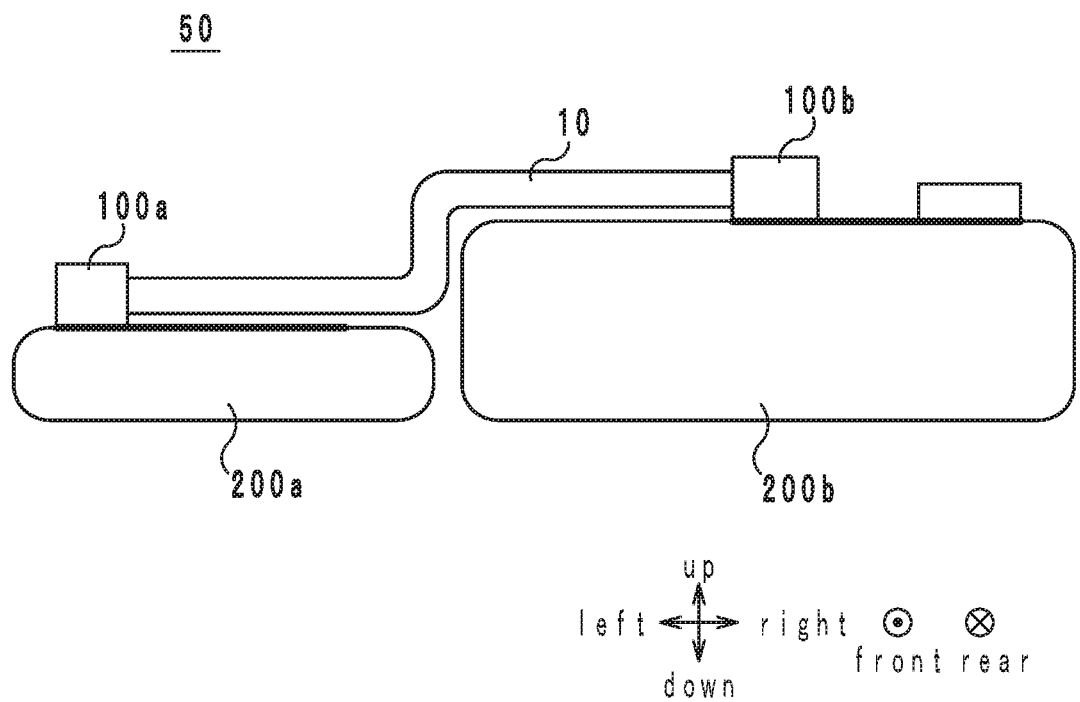
FIG. 5 is a diagram of a portion of an electronic device that includes the multilayer substrate shown in FIG. 1.

The multilayer substrate 10 described above, for example, electrically connects two circuit boards inside an electronic device. FIG. 4 is a diagram showing bending of the multilayer substrate 10 shown in FIGS. 1, 2, and 3. FIG. 5 is a diagram showing a portion of an electronic device 50 in which the multilayer substrate 10 shown in FIGS. 1, 2, and 3 is included. Features of the multilayer substrate 10 shown in each of FIGS. 4 and 5 that are the same as or similar to the features of the multilayer substrate 10 shown in FIGS. 1, 2, and 3 are denoted by the same reference characters.

As shown in FIGS. 4 and 5, the multilayer substrate 10 is bent. More specifically, the multilayer substrate 10 is bent in the central portion in the right-left direction, with the surface being bent at two sites. In order to bend the multilayer substrate 10 at two sites, as shown in FIG. 4, the multilayer substrate 10 is nipped from above and below by tools T1 and T2 with steps. The multilayer substrate 10 is heated by heating element(s), for example, by heaters built in the tools T1 and T2 (FIG. 4), and is then cooled. Accordingly, the multilayer substrate 10 is plastically deformed, and the bending of the multilayer substrate 10 is completed.

As shown in FIG. 5, the electronic device 50 includes circuit boards 200a and 200b, and connectors 100a and 100b. The circuit board 200b is located on the right side of the circuit board 200a. The upper principal surface of the circuit board 200b is at a higher level than the upper principal surface of the circuit board 200a.

The connectors 100a and 100b are mounted on the upper principal surfaces of the circuit boards 200a and 200b, respectively. The left end of the multilayer substrate 10 is inserted in the connector 100a, and the multilayer substrate 10 and the connector 100a are electrically connected to each other. The right end of the multilayer substrate 10 is inserted in the connector 100b, and the multilayer substrate 10 and the connector 100b are electrically connected to each other. The multilayer substrate 10 is bent by plastic deformation and is also flexible. Therefore, the multilayer substrate 10 is able to electrically connect the two connectors 100a and 100b, which are on different levels, to each other. In the multilayer substrate 10, digital signals are transmitted through the signal transmission conductor layers 18a and 18b. The signal transmission conductor layers 18a and 18b are included as differential transmission lines.

A method of manufacturing the multilayer substrate 10 is described below with reference to the drawings. A case of manufacturing one multilayer substrate 10 is described as an example. However, large-sized insulating sheets may stacked and cut to simultaneously manufacture a plurality of multilayer substrates 10.

First, insulating sheets 16a and 16b including a thermoplastic resin, for example, a liquid crystal polymer, are prepared. Next, a sheet of copper foil is provided entirely on one principle surface of each of the insulating sheets 16a and 16b. Specifically, a sheet of copper foil is applied onto the upper surface of the insulating sheet 16a, and a sheet of copper foil is applied onto the lower surface of the insulating sheet 16b. Further, the sheets of copper foil on the insulating sheets 16a and 16b are galvanized to reduce corrosion, and the surfaces of the sheets of copper foil are smoothed. However, any other metal foil other than copper foil may be included, for example.

Next, the copper foil provided on the upper surface of the insulating sheet 16a is patterned, and thus the signal transmission conductor layers 18a and 18b and the ground conductor layers 20a and 20b shown in FIG. 2 are provided on the upper surface of the insulating sheet 16a. Specifically, resists that are of a same or a similar shape as the signal transmission conductor layers 18a and 18b and the ground conductor layers 20a and 20b are respectively printed on the copper foil on the upper surface of the insulating sheet 16a. Next, the copper foil is etched, and the copper foil, except for the portions of the copper foil covered by the resists, is removed. Thereafter, a cleaning solution (for example, a resist remover) is sprayed to remove the resists. Thus, the signal transmission conductor layers 18a and 18b and the ground conductor layers 20a and 20b shown in FIG. 2 are provided on the upper surface of the insulating sheet 16a by photolithography.

Next, the ground conductor layer 22 shown in FIG. 2 is provided on the lower surface of the insulating sheet 16b. The process of forming the ground conductor layer 22 is the same as or similar to the process of forming the signal transmission conductor layers 18a and 18b and the ground conductor layers 20a and 20b, and the process of forming the ground conductor layer 22 will not be described.

Next, the lower surface of the insulating sheet 16a and the upper surface of the insulating sheet 16b are irradiated with laser beams at positions where the via-hole conductors v1 to v4 are to be provided, and thus through-holes are defined. The through-holes are filled with a Cu—Sn-based conductive paste.

Next, the insulating sheets 16a and 16b are stacked and press bonded. Specifically, after the insulating sheets 16a and 16b are stacked, a pressing treatment and a heating treatment (for example, thermocompression bonding) are applied to the stack of insulating sheets. The pressing treatment is performed by pressing the stack of insulating sheets 16a and 16b from above and below. By the pressing treatment and the heating treatment, the insulating sheets 16a and 16b are softened, and at a same or substantially a same time, the conductive paste in the through-holes is solidified. Accordingly, the insulating sheets 16a and 16b are bonded together, and the via-hole conductors v1 to v4 are provided.

Next, a resin paste (for example, a resist paste) is applied to the upper surface of the insulating sheet 16a and the lower surface of the insulating sheet 16b by screen printing, and thus the protective layers 15a and 15b are provided. According to the above-described process, the multilayer substrate 10 is provided.

In the multilayer substrate 10, delamination at the border between the insulating sheet 16a and the insulating sheet 16b is significantly reduced or prevented. FIG. 6A is a sectional view of the multilayer substrate 10 when the multilayer substrate 10 curves and the top surface becomes convex upward. FIG. 6B is a sectional view of the multilayer substrate 10 when the multilayer substrate 10 curves and the top surface becomes concave downward.

When the electronic device 50 (FIG. 5) is subjected to an impact, for example, if the electronic devices 50 falls, the multilayer substrate 10 shown in FIGS. 1, 2, and 3 may curve as shown in FIG. 6A or 6B. Features of the multilayer substrate 10 shown in each of FIGS. 6A and 6B that are the same as or similar to the features of the multilayer substrate 10 shown in FIGS. 1, 2, and 3 are denoted by the same reference characters. A case where the multilayer substrate 10 curves and the top surface becomes convex upward as shown in FIG. 6A is described below as an example. In this case, the signal transmission conductor layers 18a and 18b and the ground conductor layers 20a, 20b, and 22 curve and the upper surfaces become convex upward. The elasticity coefficient of the material of the signal transmission conductor layers 18a and 18b and the ground conductor layers 20a, 20b, and 22 is greater than the elasticity coefficient of the material of the insulating sheets 16a and 16b. Accordingly, the signal transmission conductor layers 18a and 18b and the ground conductor layers 20a, 20b, and 22 are less deformable than the insulating sheets 16a and 16b, and as a result, forces are applied from the signal transmission conductor layers 18a and 18b and the ground conductor layers 20a, 20b, and 22 to the insulating sheets 16a and 16b when the multilayer substrate 10 curves. Therefore, on an interface α between the insulating sheet 16a and the signal transmission conductor layers 18a and 18b and between the insulating sheet 16a and the ground conductor layers 20a and 20b, a force F1 is applied from the signal transmission conductor layers 18a and 18b and the ground conductor layers 20a and 20b to the insulating sheet 16a. The force F1 is weaker in a position farther upward from the interface α. Similarly, on an interface β between the insulating sheet 16b and the ground conductor layer 22, a force F2 is applied from the ground conductor layers 22 to the insulating sheet 16b. The force F2 is weaker in a position farther downward from the interface β.

The ratio of the total area of the signal transmission conductor layers 18a and 18b and the ground conductor layers 20a and 20b to the area of the upper surface of the insulating sheet 16a is smaller than the ratio of the area of the ground conductor layer 22 to the area of the lower surface of the insulating sheet 16b. Accordingly, the force F1 is smaller than the force F2. Therefore, a greater force is generated in the lower portion of the stack of insulating sheets 16a and 16b than in the upper portion of the stack of insulating sheets 16a and 16b.

In the multilayer substrate 10, the thickness d1 (FIG. 3) of the insulating sheet 16a is smaller than the thickness d2 (FIG. 3) of the insulating sheet 16b. Accordingly, the border between the insulating sheet 16a and the insulating sheet 16b is able to be located in the upper portion of the stack of insulating sheets 16a and 16b, and significantly reduces or prevents a force from being applied to the border between the insulating sheet 16a and the insulating sheet 16b. As a result, delamination at the border between the insulating sheet 16a and the insulating sheet 16b is able to be significantly reduced or prevented. Delamination at the border between the insulating sheet 16a and the insulating sheet 16b is also able to be significantly reduced or prevented in a case where the multilayer substrate 10 curves and the top surface becomes concave downward as shown in FIG. 6B.

In the multilayer substrate 10 according to the present preferred embodiment, delamination at the border between the insulating sheet 16a and the insulating sheet 16b is able to be further significantly reduced or prevented as discussed below.

In the multilayer substrate 10, the material defining the signal transmission conductor layers 18a and 18b and the ground conductor layers 20a, 20b, and 22 is different in a linear expansion coefficient from the material defining the insulating sheets 16a and 16b and the material defining the protective layers 15a and 15b. A case where the linear expansion coefficient of the material of the signal transmission conductor layers 18a and 18b and the ground conductor layers 20a, 20b, and 22 is smaller than the linear expansion coefficients of the material of the insulating sheets 16a and 16b and the material of the protective layers 15a and 15b is described below as an example.

When a temperature of the multilayer substrate 10 increases, for example, due to a temperature rise of the electronic device 50, the signal transmission conductor layers 18a and 18b, the ground conductor layers 20a, 20b, and 22, the insulating sheets 16a and 16b, and the protective layers 15a and 15b expand. The linear expansion coefficient of the material of the signal transmission conductor layers 18a and 18b and the ground conductor layers 20a, 20b, and 22 is smaller than the linear expansion coefficients of the material of the insulating sheets 16a and 16b and the material of the protective layers 15a and 15b. Accordingly, an amount of expansion of the signal transmission conductor layers 18a and 18b and the ground conductor layers 20a, 20b, and 22 is smaller than an amount of expansion of the insulating sheets 16a and 16b and an amount of expansion of the protective layers 15a and 15b. With the differences in the amounts of expansion between the signal transmission conductor layers 18a and 18b and the ground conductor layers 20a, 20b, and 22, and the insulating sheets 16a and 16b, and the protective layers 15a and 15b, forces to restrain the expansion of the insulating sheets 16a and 16b are generated at the interfaces α and β.

However, the ratio of the total area of the signal transmission conductor layers 18a and 18b and the ground conductor layers 20a and 20b to the area of the upper surface of the insulating sheet 16a is smaller than the ratio of the area of the ground conductor layer 22 to the area of the lower surface of the insulating sheet 16b. Accordingly, the force exerted by the signal transmission conductor layers 18a and 18b and the ground conductor layers 20a and 20b to restrain the expansion of the upper surface of the insulating sheet 16a is smaller than the force exerted by the ground conductor layer 22 to restrain the expansion of the lower surface of the insulating layer 16b. Therefore, the amount of expansion of the insulating sheet 16b is smaller than the amount of expansion of the insulating sheet 16a. Hence, the multilayer substrate 10 curves and the top surface becomes convex upward as shown in FIG. 6A.

When the multilayer substrate 10 curves and the top surface becomes concave downward as shown in FIG. 6B, at the interface α, a force F3 is applied from the signal transmission conductor layers 18a and 18b and the ground conductor layers 20a and 20b to the insulating sheet 16a, and at the interface β, a force F4 is applied from the ground conductor layer 22 to the insulating sheet 16b.

The ratio of the total area of the signal transmission conductor layers 18a and 18b and the ground conductor layers 20a and 20b to the area of the upper surface of the insulating sheet 16a is smaller than the ratio of the area of the ground conductor layer 22 to the area of the lower surface of the insulating sheet 16b. Accordingly, the force F3 is smaller than the force F4. Therefore, a greater force is generated in the lower portion of the stack of insulating sheets 16a and 16b than in the upper portion of the stack of insulating sheets 16a and 16b.

In the multilayer substrate 10, the thickness d1 of the insulating sheet 16a is smaller than the thickness d2 of the insulating sheet 16b. Accordingly, the border between the insulating sheet 16a and the insulating sheet 16b is able to be located in the upper portion of the stack of insulating sheets 16a and 16b, and significantly reduces or prevents a force from being applied to the border between the insulating sheet 16a and the insulating sheet 16b. Then, delamination at the border between the insulating sheet 16a and the insulating sheet 16b is able to be significantly reduced or prevented.

When the linear expansion coefficient of the material of the signal transmission conductor layers 18a and 18b and the ground conductor layers 20a, 20b, and 22 is greater than the linear expansion coefficients of the material of the insulating sheets 16a and 16b and the material of the protective layers 15a and 15b, the multilayer substrate 10 curves and the top surface becomes concave downward as shown in FIG. 6B. In this case, similar to the case where the linear expansion coefficient of the material of the signal transmission conductor layers 18a and 18b and the ground conductor layers 20a, 20b, and 22 is smaller than the linear expansion coefficients of the material of the insulating sheets 16a and 16b and the material of the protective layers 15a and 15b, delamination at the border between the insulating sheet 16a and the insulating sheet 16b is able to be significantly reduced or prevented.

In the multilayer substrate 10, the via-hole conductors v1 to v4 (FIGS. 2 and 3) are able to be included as interlayer connection conductors that electrically connect the ground conductor layers 20a and 20b to the ground conductor layer 22. More specifically, one insulating sheet may be included instead of the two insulating sheets 16a and 16b. A multilayer substrate where only one insulating sheet is included is referred to as a multilayer substrate according to a comparative example. In the multilayer substrate according to the comparative example, the signal transmission conductor layers 18a and 18b and the ground conductor layers 20a and 20b are located on the upper surface of the insulating sheet, and the ground conductor layer 22 is located on the lower surface of the insulating sheet. The ground conductor layers 20a and 20b are electrically connected to the ground conductor layer 22 by via-hole conductors that pierce through the one insulating sheet.

In the multilayer substrate according to the comparative example, however, it is difficult to include via-hole conductors as interlayer connection conductors, and through-hole conductors are instead included. More specifically, in the multilayer substrate according to the comparative example, metal foil is provided on both surfaces of the insulating sheet, and therefore, the insulating sheet undergoes the following process to define via-hole conductors. The insulating sheet is irradiated with laser beams to define through-holes that pierce through the insulating sheet and the metal foil on one of the surfaces and does not pierce through the metal foil on the other surface. Thereafter, the through-holes are filled with a conductive paste. In this process, it is difficult to adjust the intensity of the laser beams. Specifically, if the intensity of the laser beams is too high, the through-holes may pierce through the metal foil on both surfaces of the insulating sheet. In this case, the conductive paste may leak from the through-holes. On the other hand, if the intensity of the laser beams is too low, the through-holes may not pierce through the insulating sheet. In this case, the electrical connection between the via-hole conductors and the metal foil may be poor.

To address the issues associated with the multilayer substrate according to the comparative example as described above, in the multilayer substrate 10 according to the present preferred embodiment, the signal transmission conductor layers 18a and 18b and the ground conductor layers 20a and 20b are located on the upper surface of the insulating sheet 16a, and the ground conductor layer 22 is located on the lower surface of the insulating sheet 16b. Therefore, through-holes may be defined by irradiating the insulating sheets 16a and 16b with laser beams from the lower surface and the upper surface, respectively. Accordingly, in the multilayer substrate 10, the via-hole conductors v1 to v4 are able to be included as interlayer connection conductors to electrically connect the ground conductor layers 20a and 20b to the ground conductor layer 22.

Figure 6C:
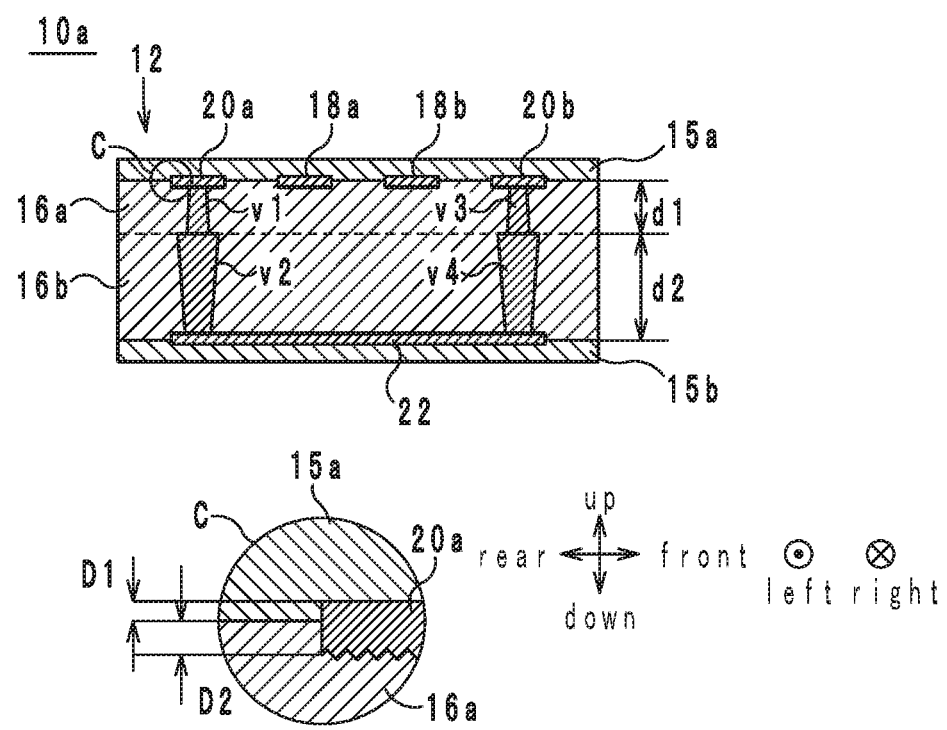
FIG. 6C is a sectional view and an enlarged view of a multilayer substrate according to a modification of a preferred embodiment of the present invention.

A multilayer substrate 10a according to a modification of a preferred embodiment of the present invention is described below with reference to the drawings. FIG. 6C is a sectional view and an enlarged view of the multilayer substrate 10a according to the modification. The sectional view shown in FIG. 6C is along the line A-A in FIG. 1.

The multilayer substrate 10a differs from the multilayer substrate 10 of FIGS. 1-3 in that the signal transmission conductor layers 18a and 18b and the ground conductor layers 20a and 20b are partially buried in the insulating sheet 16a and the ground conductor layer 22 is partially buried in the insulating sheet 16b. The following description of the multilayer substrate 10a focuses on the differences, and the features of the multilayer substrate 10a that are the same as or similar to the features of the multilayer substrate 10 are generally shown in and described with respect to FIGS. 1 and 2. Thus, features of the multilayer substrate 10a shown in FIG. 6C that are the same as or similar to the features of the multilayer substrate 10 shown in FIGS. 1, 2, and 3 are denoted by the same reference characters. FIG. 3 does not show the difference in surface roughness between the upper surface and the lower surface of each of the signal transmission conductor layers 18a and 18b and the ground conductor layers 20a, 20b, and 22. FIG. 6C, however, shows the difference in surface roughness between the upper surface and the lower surface of each of the signal transmission conductor layers 18a and 18b and the ground conductor layers 20a, 20b, and 22.

As shown in FIG. 6C, the lower surfaces and the lower portions of the signal transmission conductor layers 18a and 18b and the ground conductor layers 20a and 20b are buried in the insulating sheet 16a. More specifically, the signal transmission conductor layers 18a and 18b and the ground conductor layers 20a and 20b are buried in the insulating sheet 16a to a depth of D2, and protrude from the upper surface of the insulating sheet 16a to a thickness of D1. The values D1 and D2 satisfy the condition, D1<D2, as shown in sectional view C in FIG. 6C.

Also, the upper surface and the upper portion of the ground conductor layer 22 are buried in the insulating sheet 16b. More specifically, the ground conductor layer 22 is buried in the insulating sheet 16b to a depth of D2, and protrudes from the lower surface of the insulating sheet 16b to a thickness of D1. The values D1 and D2 satisfy the condition, D1<D2. The other portions of the multilayer substrate 10a are the same as or similar to those of the multilayer substrate 10, and descriptions thereof are omitted.

Figure 6D:
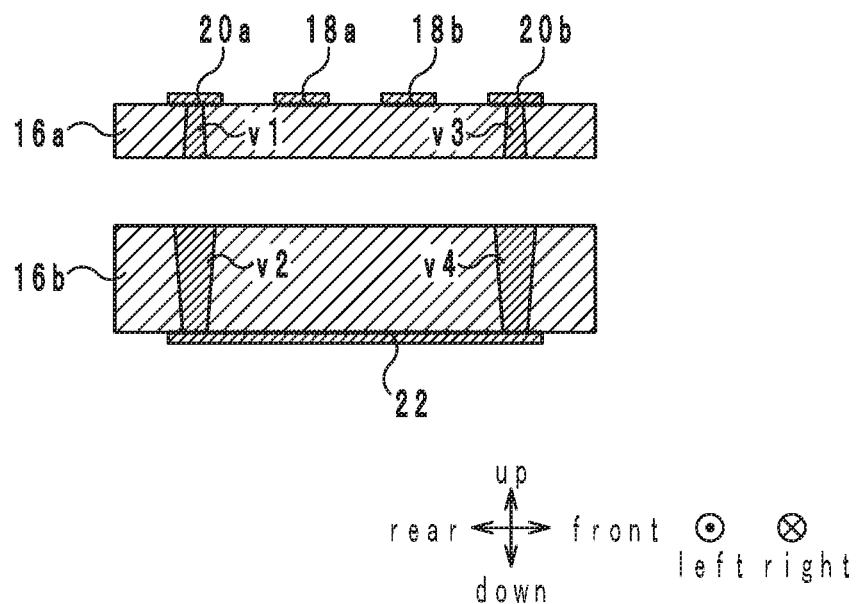
FIG. 6D is a sectional view of the multilayer substrate shown in FIG. 6C during a manufacturing process thereof.
Figure 6E:
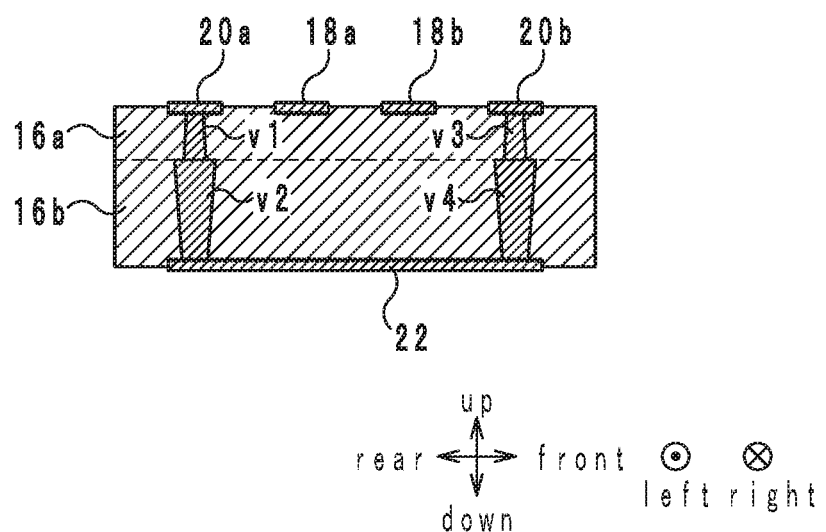
FIG. 6E is a sectional view of the multilayer substrate shown in FIG. 6C during the manufacturing process thereof.

Next, a method of manufacturing the multilayer substrate 10a is described. FIGS. 6D and 6E are sectional views showing a manufacturing process of the multilayer substrate 10a shown in FIG. 6C. Features of the multilayer substrate 10a shown in the manufacturing process of the multilayer substrate 10a in FIG. 6C that are the same as or similar to the features of the multilayer substrate 10 shown in FIGS. 1, 2, and 3 are denoted by the same reference characters. In the manufacturing method of the multilayer substrate 10a, all the steps except the step of pressure bonding the insulating sheets 16a and 16b are the same as or similar to those of the manufacturing method of the multilayer substrate 10 of FIGS. 1-3. In the following, therefore, only the pressure boding step is described, and the other steps will not be described.

As shown in FIG. 6D, the insulating sheets 16a and 16b are stacked. At this stage, the signal transmission conductor layers 18a and 18b and the ground conductor layers 20a and 20b are not buried in the insulating sheet 16a and are on the upper surface of the insulating sheet 16a. Similarly, the ground conductor layer 22 is not buried in the insulating sheet 16b and is on the lower surface of the insulating sheet 16b.

Next, as shown in FIG. 6E, a pressing treatment and a heating treatment, for example, thermocompression bonding, are applied to the stack of insulating sheets 16a and 16b. The thermocompression bonding is performed by applying a greater force to the dies than the force applied during thermocompression bonding during the manufacturing process of the multilayer substrate 10. Accordingly, the signal transmission conductor layers 18a and 18b and the ground conductor layers 20a and 20b are pressed into the insulating sheet 16a and are buried therein. Similarly, the ground conductor layer 22 is pressed into the insulating sheet 16b and is buried therein.

The multilayer substrate 10a provides the same or similar features and advantages as the multilayer substrate 10.

Also, since the signal transmission conductor layers 18a and 18b and the ground conductor layers 20a and 20b are buried in the insulating sheet 16a, peeling of the signal transmission conductor layers 18a and 18b and the ground conductor layers 20a and 20b from the insulating sheet 16a is significantly reduced or prevented. Similarly, since the ground conductor layer 22 is buried in the insulating sheet 16b, peeling of the ground conductor layer 22 from the insulating sheet 16b is significantly reduced or prevented. In this modification, the condition D1<D2 (FIG. 6C) is satisfied. Thus, with regard to each of the signal transmission conductor layers 18a and 18b and the ground conductor layers 20a and 20b, an amount buried in the insulating sheet 16a is greater than an amount not buried in the insulating sheet 16a. With this arrangement, peeling of the signal transmission conductor layers 18a and 18b and the ground conductor layers 20a and 20b is further significantly reduced or prevented. Similarly, with regard to the ground conductor layer 22, the amount buried in the insulating sheet 16b is greater than the amount not buried in the insulating sheet 16b. With this arrangement, peeling of the ground conductor layer 22 is further significantly reduced or prevented.

The features and elements of the multilayer substrate 10a provide an increased range of choice of material of the protective layer 15a (FIG. 6C). More specifically, in the multilayer substrate 10, the protective layer 15a is provided between the signal transmission conductor layer 18a and the signal transmission conductor layer 18b. In the multilayer substrate 10a, on the other hand, the insulating sheet 16a and the protective layer 15a are provided between the signal transmission conductor layer 18a and the signal transmission conductor layer 18b. A material with a relatively low relative dielectric constant, for example, a liquid crystal polymer or the like, is included as the material of the insulating sheet 16a. Therefore, the relative dielectric constant of the portion between the signal transmission conductor layers 18a and 18b in the multilayer substrate 10a is lower than the relative dielectric constant of the portion between the signal transmission conductor layers 18a and 18b in the multilayer substrate 10. Accordingly, a capacitance between the signal transmission conductor layers 18a and 18b in the multilayer substrate 10a is smaller than a capacitance between the signal transmission conductor layers 18a and 18b in the multilayer substrate 10. The relative dielectric constant of the protective layer 15a in the multilayer substrate 10a may be higher than the relative dielectric constant of the protective layer 15a in the multilayer substrate 10. Also, since the capacitance between the signal transmission conductor layers 18a and 18b is preferably small, the relative dielectric constant of the protective layer 15a in the multilayer substrate 10a may be equal or substantially equal to the relative dielectric constant of the protective layer 15a in the multilayer substrate 10. Thus, in the multilayer substrate 10a, there is greater flexibility in setting the relative dielectric constant of the protective layer 15a. Accordingly, a material of the protective layer 15a in the multilayer substrate 10a is able to be selected from a wide range.

Figure 6F:
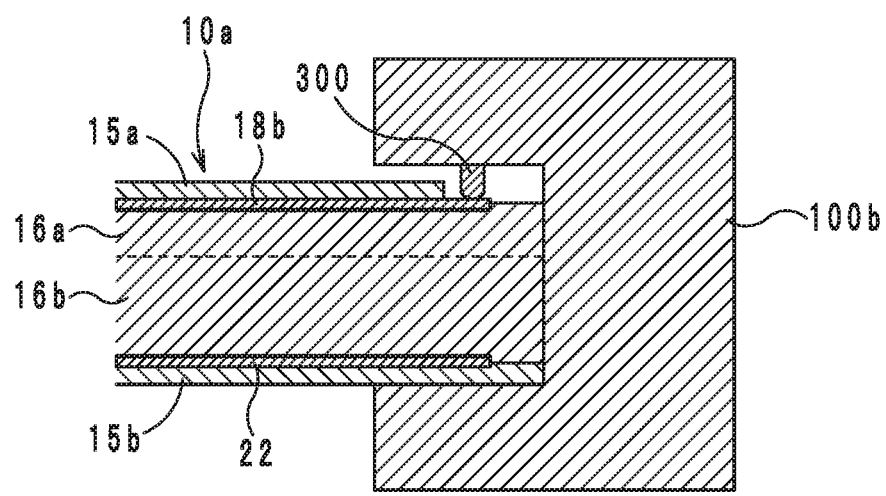
FIG. 6F is a sectional view of a right end portion of the multilayer substrate shown in FIG. 6C and a connector.

The multilayer substrate 10a is able to be easily inserted in the connectors 100a and 100b (FIG. 5). A case of inserting the multilayer substrate 10a in the connector 100b is described as an example. FIG. 6F is a sectional view of the right end portion of the multilayer substrate 10a shown in FIG. 6C and the connector 100b. Thus, features of the multilayer substrate 10a shown in each of FIGS. 6C and 6F that are the same as or similar to the features of the multilayer substrate 10 shown in FIGS. 1, 2, and 3 are denoted by the same reference characters.

The level of the upper surface of the signal transmission conductor layers 18a and 18b and the ground conductor layers 20a and 20b is different from the level of the upper surface of the insulating sheet 16a as shown in FIG. 6C, and there is a step at each end of the conductors. Therefore, when the multilayer substrate 10a is inserted in the connector 100b, a terminal 300 may be impeded by the step at each end of the conductors. However, as also shown in FIG. 6C, in the multilayer substrate 10a, the signal transmission conductor layers 18a and 18b and the ground conductor layers 20a and 20b are partially buried in the insulating sheet 16a. Therefore, the level difference between the upper surface of the insulating sheet 16a and the upper surface of the signal transmission conductor layers 18a and 18b and the ground conductor layers 20a and 20b is small. Accordingly, the terminal 300 is able to be prevented from being impeded by the step at each end of the conductors and the multilayer substrate 10a is able to be easily inserted in the connector 100b. By preventing the terminal 300 from being impeded by the step at each end of the conductors, a decrease in the force applied from the terminal 300 to the signal transmission conductor layers 18a and 18b and the ground conductor layers 20a and 20b during insertion of the multilayer substrate 10a is able to be provided. Accordingly, peeling of the signal transmission conductor layers 18a and 18b and the ground conductor layers 20a and 20b from the insulating sheet 16a is significantly reduced or prevented. The above description of the case of inserting the multilayer substrate 10a in the connector 100b is equally applied to a case of inserting the multilayer substrate 10a in the connector 100a, and the insertion in the connector 100a (FIG. 5) will not be described.

Other Preferred Embodiments

Multilayer substrates according to preferred embodiments of the present invention are not limited to the multilayer substrates 10 and 10a, and various changes and modifications are possible without departing from the scope of preferred embodiments of the present invention. The elements of the multilayer substrate 10 and the elements of the multilayer substrate 10a may be combined with or replace one another.

The element assembly 12 may not include the protective layers 15a and 15b. In other words, the element assembly 12 preferably includes at least the insulating sheets 16a and 16b. The protective layers 15a and 15b may be substituted with insulating layers including a same or substantially a same material of the insulating sheets 16a and 16b.

In the multilayer substrates 10 and 10a, the signal transmission conductor layers 18a and 18b and the ground conductor layers 20a and 20b are located on the upper surface of the insulating sheet 16a, but any other conductor layers (for example, conductor layers of an inductor, a capacitor, or the like) may be located on the upper surface of the insulating sheet 16a. Similarly, in the multilayer substrates 10 and 10a, the ground conductor layer 22 is located on the lower surface of the insulating sheet 16b, but any other conductor layers (for example, conductor layers of an inductor, a capacitor, or the like) may be located on the lower surface of the insulating sheet 16b.

The via-hole conductors v1 to v4 may be omitted.

The multilayer substrates 10 and 10a are signal lines that electrically connect two circuit boards. However, each of the multilayer substrates 10 and 10a may be a circuit board on which an electronic device is to be mounted.

The preferred embodiments of the present invention are able to be applied to multilayer substrates to significantly reduce or prevent delamination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a flexible element assembly including a plurality of insulating layers stacked on one another in a layer stacking direction, the plurality of insulating layers including at least a first insulating layer with a first principal surface and a second principal surface and a second insulating layer with a third principal surface and a fourth principal surface;
    a first conductor layer; and
    a second conductor layer; wherein
    the second principal surface and the third principal surface are in contact with each other;
    no planar or linear conductors are located on the second principal surface and the third principal surface;

the first conductor layer is located on a portion of the first principal surface;

the second conductor layer is located on a portion of the fourth principal surface;

a ratio of an area of the portion of the first principal surface on which the first conductor layer is located to an area of the first principal surface is lower than a ratio of an area of the portion of the fourth principal surface on which the second conductor layer is located to an area of the fourth principal surface;

a thickness of the first insulating layer is smaller than a thickness of the second insulating layer; and a material defining the first conductor layer and the second conductor layer is different with respect to a linear expansion coefficient from a material defining the first insulating layer and the second insulating layer.

2. A multilayer substrate comprising:

a flexible element assembly including a plurality of insulating layers stacked on one another in a layer stacking direction, the plurality of insulating layers including at least a first insulating layer with a first principal surface and a second principal surface and a second insulating layer with a third principal surface and a fourth principal surface;

a first conductor layer; and a second conductor layer; wherein the second principal surface and the third principal surface are in contact with each other;

no planar or linear conductors are located on the second principal surface and the third principal surface;

the first conductor layer is located on a portion of the first principal surface;

the second conductor layer is located on a portion of the fourth principal surface;

a ratio of an area of the portion of the first principal surface on which the first conductor layer is located to an area of the first principal surface is lower than a ratio of an area of the portion of the fourth principal surface on which the second conductor layer is located to an area of the fourth principal surface;

a thickness of the first insulating layer is smaller than a thickness of the second insulating layer; and a material defining the first conductor layer and the second conductor layer is different with respect to an elasticity coefficient from a material defining the first insulating layer and the second insulating layer.

3. The multilayer substrate according to claim 2, wherein the plurality of insulating layers include one or more other insulating layers in addition to the first insulating layer and the second insulating layer; and no conductor layers are located on the one or more other insulating layers.

4. The multilayer substrate according to claim 2, wherein a surface roughness of each surface of the first and second conductor layers that are in contact with the first insulating layer is greater than a surface roughness of each surface of the first and second conductor layers that are not in contact with first insulating layer.

5. The multilayer substrate according to claim 2, wherein the first conductor layer includes a linear signal transmission conductor; and the second conductor layer includes a planar ground conductor.

6. The multilayer substrate according to claim 5, wherein the element assembly has a strip shape.

7. The multilayer substrate according to claim 2, wherein the first insulating layer and the second insulating layer are thermocompression-bonded to each other.

8. The multilayer substrate according to claim 2, further comprising:

a first via-hole conductor piercing through the first insulating layer along the layer stacking direction; and a second via-hole conductor piercing through the second insulating layer along the layer stacking direction; wherein the first via-hole conductor and the second via-hole conductor connect with each other and electrically connect the first conductor layer and the second conductor layer to each other.

9. The multilayer substrate according to claim 8, wherein the first via-hole conductor is included in a plurality of first via-hole conductors that are arranged in a line at uniform or substantially uniform intervals; and the second via-hole conductor is included in a plurality of second via-hole conductors that are arranged in a line at uniform or substantially uniform intervals.

10. The multilayer substrate according to claim 8, wherein the first via-hole conductor and the second via-hole conductor are each made of a sintered conductive paste.

11. The multilayer substrate according to claim 2, wherein end portions of the first and second conductor layers define and function as external electrodes that are exposed to an exterior of the multilayer substrate.

12. The multilayer substrate according to claim 2, wherein one of the plurality of insulating layers defines a protective layer that covers at least a portion of the first principal surface of the first insulating layer.

13. The multilayer substrate according to claim 2, wherein one of the plurality of insulating layers defines a protective layer that covers at least a portion of the fourth principal surface of the second insulating layer.

14. The multilayer substrate according to claim 2, wherein a ground conductor layer is partially buried in the second insulating layer.

15. An electronic device comprising:

a first circuit board;

a second circuit board; and the multilayer substrate according to claim 2; wherein the multilayer substrate electrically connects the first circuit board to the second circuit board.

16. The multilayer substrate according to claim 2, wherein the multilayer substrate includes a bent portion in a central portion thereof.

17. The multilayer substrate according to claim 16, wherein the bent portion is defined by a plastically deformed portion of the multilayer substrate.

18. The multilayer substrate according to claim 2, wherein the first conductor layer and the second conductor layer define a differential transmission line.

19. The multilayer substrate according to claim 2, wherein the first conductor layer is partially buried in the first insulating layer, and the second conductor layer is partially buried in the second insulating layer.

20. A multilayer substrate comprising:

a flexible element assembly including a plurality of insulating layers stacked on one another in a layer stacking direction, the plurality of insulating layers including at least a first insulating layer with a first principal surface and a second principal surface and a second insulating layer with a third principal surface and a fourth principal surface;

a first conductor layer; and a second conductor layer; wherein
the second principal surface and the third principal surface are in contact with each other;
no planar or linear conductors are located on the second principal surface and the third principal surface;
the first conductor layer is located on a portion of the first principal surface;
the second conductor layer is located on a portion of the fourth principal surface;
a ratio of an area of the portion of the first principal surface on which the first conductor layer is located to an area of the first principal surface is lower than a ratio of an area of the portion of the fourth principal surface on which the second conductor layer is located to an area of the fourth principal surface;
a thickness of the first insulating layer is smaller than a thickness of the second insulating layer; and
the first and second conductor layers are less deformable than the first and second insulating layers.

* * * * *